United States Patent
Choi et al.

(10) Patent No.: US 8,263,873 B2
(45) Date of Patent: Sep. 11, 2012

(54) FLEXIBLE PRINTED CIRCUIT BOARD FOR LARGE CAPACITY SIGNAL TRANSMISSION MEDIUM

(75) Inventors: Gyoung Duck Choi, Uiwang-si (KR); Byeong Sik Son, Yongin-si (KR)

(73) Assignees: Evertechno Co., Ltd., Chungcheongnam-do (KR); Gyoung Duck Choi, Gyeonggi-do (KR)

( * ) Notice: Subject to any disclaimer, the term of this patent is extended or adjusted under 35 U.S.C. 154(b) by 354 days.

(21) Appl. No.: 12/588,562

(22) Filed: Oct. 20, 2009

(65) Prior Publication Data

US 2010/0096167 A1    Apr. 22, 2010

(30) Foreign Application Priority Data

Oct. 21, 2008 (KR) .................. 10-2008-0103083

(51) Int. Cl.
*H05K 1/00*    (2006.01)
*H05K 1/11*    (2006.01)

(52) U.S. Cl. ........ 174/254; 174/255; 174/256; 174/257; 174/258; 174/259

(58) Field of Classification Search .................. 174/254, 174/261, 250, 256, 258–259
See application file for complete search history.

(56) References Cited

U.S. PATENT DOCUMENTS

| | | | | | |
|---|---|---|---|---|---|
| 4,441,088 | A | * | 4/1984 | Anderson | 333/1 |
| 5,027,088 | A | * | 6/1991 | Shimizu et al. | 333/1 |
| 5,334,800 | A | * | 8/1994 | Kenney | 174/250 |
| 5,418,504 | A | * | 5/1995 | Nottenburg | 333/1 |
| 5,519,363 | A | * | 5/1996 | Boudreau et al. | 333/1 |
| 5,982,249 | A | * | 11/1999 | Bruns | 333/1 |
| 6,522,173 | B1 | * | 2/2003 | Otsuka | 326/101 |
| 7,598,823 | B2 | * | 10/2009 | Yeh | 333/4 |
| 7,609,125 | B2 | * | 10/2009 | van Quach et al. | 333/5 |
| 7,719,378 | B2 | * | 5/2010 | Blair et al. | 333/1 |
| 2005/0252678 | A1 | | 11/2005 | Lee et al. | |
| 2009/0288864 | A1 | * | 11/2009 | Iben et al. | 174/259 |

\* cited by examiner

*Primary Examiner* — Angel R Estrada
*Assistant Examiner* — Dimary Lopez
(74) *Attorney, Agent, or Firm* — Rosenberg, Klein & Lee

(57) ABSTRACT

Provided is a flexible printed circuit board (FPCB) for a large capacity signal transmission medium that may maintain an impedance suitable for accurately transmitting a large capacity signal such as a low-voltage differential signaling (LVDS) signal and may also have an excellent flexibility. A copper foil large capacity signal wire includes a plurality of first pads and a plurality of second pads that are spaced apart from each other at predetermined intervals and are alternately provided, to receive a large capacity signal from a television main board and to transmit the received large capacity signal to a display device. The first pad has a positive phase and the second pad has a negative phase. A copper foil ground layer is attached at a distance from the cooper foil large capacity signal layer to ground the large capacity signal that is transmitted to and is returned from the display device.

4 Claims, 3 Drawing Sheets

FLEXIBLE PRINTED CIRCUIT BOARD FOR LARGE CAPACITY SIGNAL TRANSMISSION MEDIUM

CROSS-REFERENCE TO RELATED APPLICATION

This application claims the benefit of Korean Patent Application No. 10-2008-0103083, filed on Oct. 21, 2008, in the Korean Intellectual Property Office, the disclosure of which is incorporated herein by reference.

BACKGROUND OF THE INVENTION

1. Field of the Invention

The present invention relates to a printed circuit board (PCB), and more particularly, to a flexible PCB (FPCB) that is used as a transmission medium of a large capacity signal such as a low-voltage differential signaling (LVDS) signal.

2. Description of the Related Art

Currently, a digital television (TV) may display an image using a liquid crystal display (LCD) or a plasma display panel (PDP). The digital TV generally uses the LCD or the PDP for a display. Thus, a thickness of a printed circuit board (PCB) may need to be slimmed to make a thickness of a TV product thin. As the TV product becomes enlarged, a structure of the TV product may need to become flexible. The digital TV set is applied to flexible flat cable (FFC) for a low-voltage differential signaling (LVDS) signal transmission medium. The conventional LVDS signal transmission medium FFC may be easily manufactured, however, requires a relatively great manual operation that may not be automated. Also, the conventional signal transmission medium FFC has an insufficient capability of transmitting an LVDS signal and has a problem in an electromagnetic compatibility (EMC). Due to the manual operation, when the FFC is used for a long period of time, a quality may be deteriorated. Since a thickness of the FFC is about 1000 µm, it is difficult to use the FFC for a slim product and to perform a manufacture automation.

SUMMARY OF THE INVENTION

To The prevent invention provides a flexible printed circuit board (FPCB) for a large capacity signal transmission medium that may maintain an impedance suitable for accurately transmitting a large capacity signal such as a low-voltage differential signaling (LVDS) signal, and may also have an excellent flexibility.

According to an aspect of the present invention, there is provided a flexible printed circuit board (FPCP) for a large capacity signal transmission medium, the FPCP including: a copper foil large capacity signal wire including a plurality of first pads and a plurality of second pads that are spaced apart from each other at predetermined intervals and are alternately provided, to receive a large capacity signal from a television main board and to transmit the received large capacity signal to a display device, wherein the first pad has a positive phase and the second pad has a negative phase; a copper foil ground layer being attached at a distance from the cooper foil large capacity signal layer to ground the large capacity signal that is transmitted to and is returned from the display device; and an insulating layer being attached between the copper foil large capacity signal wire and the copper ground layer to insulate between the copper foil large capacity signal wire and the cooper foil ground layer. A width of each of the first pad and the second pad of the copper foil large capacity signal wire may have a range of 40 to 400 µm, an interval between the first pad and the second pad may have a range of 40 to 450 µm, a thickness of each of the first pad, the second pad, and the copper foil ground layer may have a range of 17 to 40 µm, and a thickness of the insulating layer may have a range of 10 to 170 µm, so that the first pad and the second pad are controlled to be 80 to 110Ω impedance.

The large capacity signal may include a low-voltage differential signaling (LVDS) signal. The insulating layer may be formed of polyimide of which a dielectric constant is 2.0 to 3.5.

The FPCB may further include: a first adhesive layer with a thickness of 5 to 25 µm attaching the first pad and the second pad of the copper foil large capacity signal wire and the insulating layer using a first adhesive agent; a second adhesive layer with a thickness of 5 to 25 µm attaching the copper foil ground layer and the insulating layer using a second adhesive agent; a copper foil power wire with a thickness of 17 to 40 µm being attached at a distance from any one of the first pad and the second pad of the copper foil large capacity signal wire; a third adhesive layer with a thickness of 20 to 30 µm being provided on the copper foil large capacity signal wire to cover the copper foil large capacity signal wire and the copper foil power wire; a first coverlay layer with a thickness of 7 to 17 µm being attached onto the third adhesive layer to protect the copper foil large capacity signal wire; a fourth adhesive layer with a thickness of 20 to 30 µm being sprayed over the copper foil ground foil; and a second coverlay layer with a thickness of 7 to 17 µm being attached onto the fourth adhesive layer to protect the copper foil ground layer. The entire thickness of the FPCB may be within a range of 108 to 394 µm.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Hereinafter, a flexible printed circuit board (FPCB) for a large capacity signal transmission medium according to an embodiment of the present invention will be described in detail with reference to the accompanying drawings.

Figure 1:
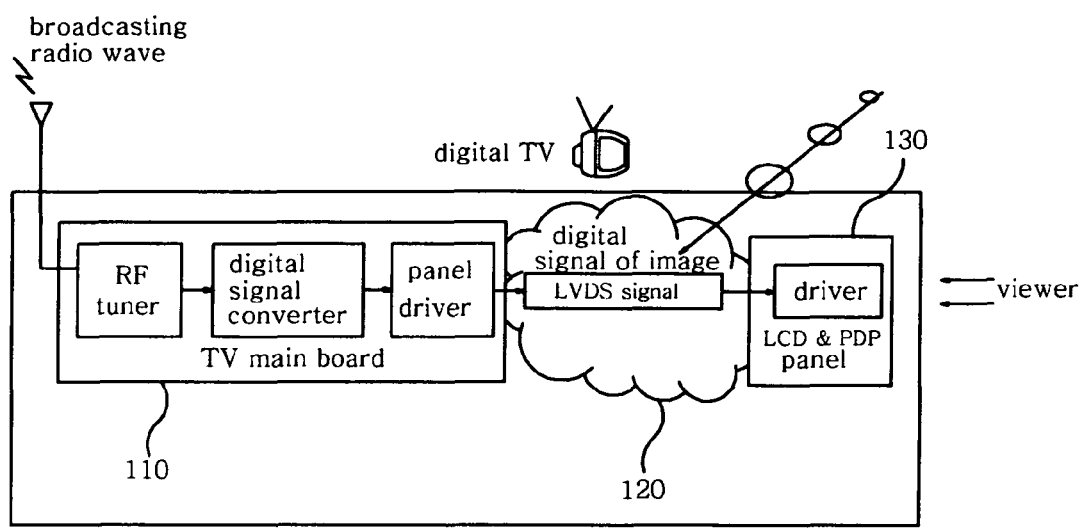
FIG. 1 is a block diagram illustrating a structure of a general digital television (TV)

FIG. 1 is a block diagram illustrating a structure of a digital television (TV). Referring to FIG. 1, the digital TV may convert a digital broadcasting signal to a digital signal in a TV, that is, a TV main board 110 and transmit a low-voltage differential signaling (LVDS) signal to a display device 130 such as a liquid crystal display (LCD) or a plasma display panel (PDP) using an LVDS transmission medium 120 and thereby display the LVDS signal in a form of an image recognizable by a viewer.

Figure 2:
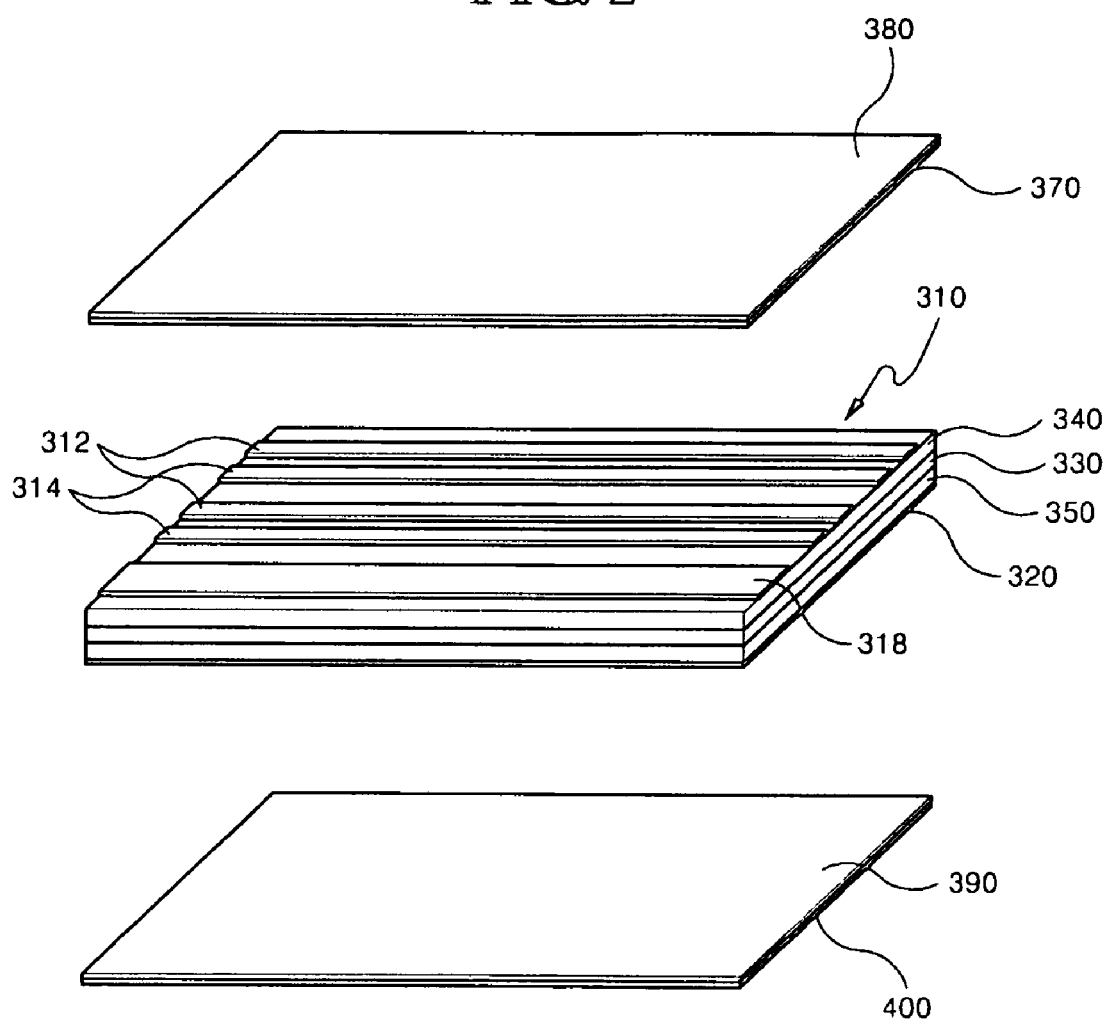
FIG. 2 is an exploded perspective view illustrating a flexible printed circuit board (FPCB) for a large capacity signal transmission medium according to an embodiment of the present invention.
Figure 3:
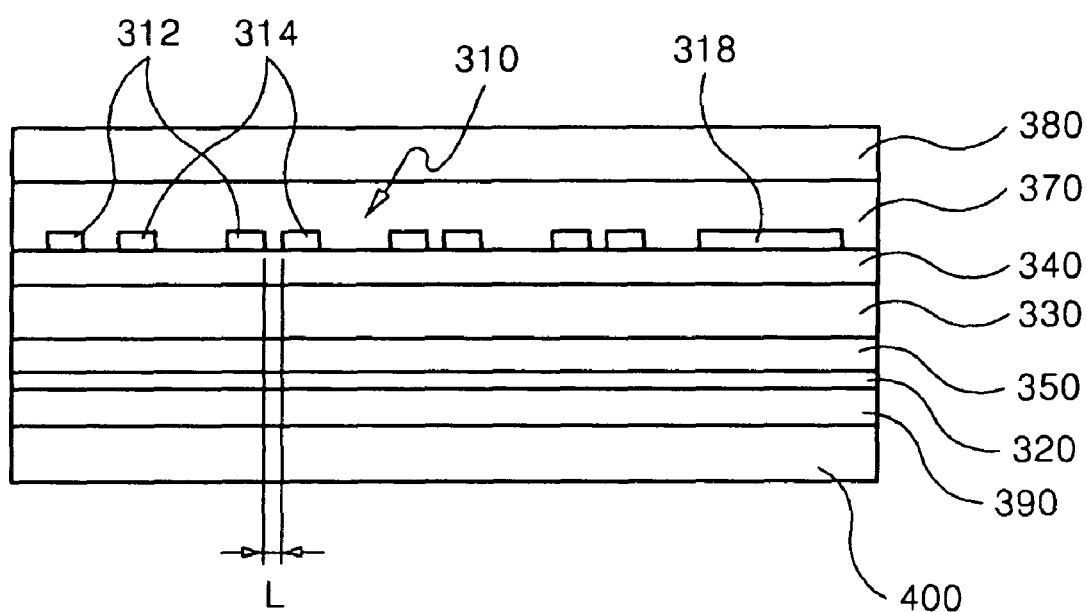
FIG. 3 is a cross-sectional view of the FPCB for the large capacity signal transmission medium of FIG. 2.

FIG. 2 is an exploded perspective view illustrating an FPCB for a large capacity signal transmission medium according to an embodiment of the present invention. FIG. 3 is a cross-sectional view of the FPCB for the large capacity signal transmission medium of FIG. 2.

According to an embodiment of the present invention, the FPCB for the large capacity signal transmission medium may include a copper foil large capacity signal wire 310, a copper foil ground layer 320, and an insulating layer 330.

The cooper foil large capacity signal layer 310 includes a plurality of first pads 312 and a plurality of second pads 314 that are spaced party form each other predetermined intervals L, and are alternatively provided. The first pad 312 has a positive phase and the second pad 314 has a negative phase. The cooper foil large capacity signal layer 310 receives a large capacity signal from a TV main board 110 to transmit the received large capacity signal to the display device 130. Although four pairs of first pads 312 and second pads 134 are shown in FIGS. 2 and 3, the present invention is not limited thereto. Specifically, five to 16 pairs of first pads 312 and second pads 314 may be applicable.

The large capacity signal may include an LVDS signal. With the development of industry, there is an increasingly need to transmit a large amount of data at a high rate. Since great constraints result from an existing transistor-transistor logic (TTL)-based communication, there is a need for a new communication standard. Accordingly, an existing serial-type interface is changed to a parallel-type interface and a transmission width is expanded to 8 bits, 16 bits, 32 bits, and the like. However, each interface has its own advantage and disadvantage. Various types of tasks such as a complicity of EMI policy, an increase of wires, an increase of consumption power, an increase of costs, and the like. As a way to solve the physical bottleneck effect, an LVDS scheme is proposed and is employed as a standard in an Institute of Electrical and Electronics Engineers (IEEE) and an American National Standards Institute/Electronic Industries Alliance (ANSI/EIA).

As a demand for generating and processing data at a high speed increases, a capability of transmitting the data from one point to another point becomes an important criterion to determine the entire system performance. Accordingly, the LVDS is popular as a solution to enhance the high-speed data transmission. The LVDS is applied to devices such as software defined radio (SDR), a high performance data converter, a high definition flat panel monitor, a digital TV, and the like. The LVDS corresponds to a high speed digital interface that is a general interface standard for high speed data transmission, and has characteristics such as a low-power consumption and an excellent noise resistance for the high speed data transmission. After the LVDS is standardized as the ANSI/TIA/EIA-644, the LVDS is being applied in various types of applications and industries. The ANSI/TIA/EIA-644 standard defines only an electrical characteristic of an LVDS interface driver output and a receiver input, and does not define a particular communication protocol, a required process technology, a medium, a power supply, and the like. Also, an ANSI/TIA/EIA-644-1995 standard corresponds to an electronic interface and thus defines specifications of a physical layer. The ANSI/TIA/EIA-644-1995 standard defines only an electrical characteristic of a driver and a receiver, and does not particularly define a characteristic of a protocol, interconnection, and a connector since they are different for each application. An LVDS standardization group defines only a standard regarding the electrical characteristic and thus induces the LVDS to be used as a multipurpose interface. Each application using the LVDS may need to refer to a corresponding protocol and interconnection standard.

Due to the characteristic that the LVDS is multipurpose and is not specified for a particular application, the LVDS is adopted for various fields of commercial and military applications. Also, as a demand for a bandwidth increases, high performance technologies such as a hyper transmission and a PCI express based on a high speed LVDS connection emerge. As the low power consumption, the excellent noise resistance, and various commercial LVDS components become available, the LVDS is popular as a stable and long-term solution for high speed data transmission in various national defense and spacecraft applications.

Currently, various types of application fields are using the LVDS. For example, in addition to a hub having a stack function for a data communication, a mobile communication radio base station, an ATM switch application, an flat panel display (FPD) for a computer, a server, peripheral devices such as a printer and a digital copy machine, an industrial high definition (HD) display, an FPD market for an automobile, and the like use the LVDS. In these applications, high speed data may move within a system or between systems. The data movement within the system is called as an intra system. The LVDS solution is generally used in this field. Information movement between systems needs a standard communication protocol such as an IEEE1394, an optical channel, a gigabit Ethernet, and the like. Since hardware and software of these protocols are expensive, it is difficult to embody them in the intra system. Accordingly, an inexpensive and simple LVDS link is generally adopted in the intra system. The LVDS solution may be advantageous for data transmission on a board, and between boards, modules, shelves, racks or boxes. A transmission medium may use a copper line or a trace of a PCB. The LVDS may be able to execute a protocol for a communication between systems.

The copper foil ground layer 320 is attached at a distance from the cooper foil large capacity signal layer 320 to ground the large capacity signal that is transmitted to and is returned from the display device 130.

The insulating layer 330 is attached between the copper foil large capacity signal wire 310 and the copper ground layer 320 to insulate between the copper foil large capacity signal wire 310 and the cooper foil ground layer 320, and thereby maintain a constant interval therebetween. The insulating layer 330 may be formed of polyimide of which a dielectric constant is 2.0 to 3.5. The insulating material may have a constant dielectric constant. Since general polyimide has a dielectric constant of 4.2 to 4.7, it may be difficult to make a thickness thin. The material used for the present invention has a dielectric constant of 2.5 to 3.5. Specifically, the material has a good dielectric constant even for a thin thickness and thus it is possible to obtain a desired impedance value.

A width of each of the first pad 312 and the second pad 314 of the copper foil large capacity signal wire 310 may have a range of 40 to 400 μm, an interval between the first pad 312 and the second pad 34 may have a range of 40 to 450 μm, a thickness of each of the first pad 312, the second pad 314, and the copper foil ground layer 320 may have a range of 17 to 40 μm, and a thickness of the insulating layer 330 may have a range of 10 to 170 μm, so that the first pad 312 and the second pad 314 may be controlled to be 80 to 110Ω impedance.

According to an embodiment of the present invention, the FPCB for the large capacity signal transmission medium may further include: a first adhesive layer 340 with a thickness of 5 to 25 μm attaching the first pad 312 and the second pad 314 of the copper foil large capacity signal wire 310 and the insulating layer 330 using a first adhesive agent; a second adhesive layer 350 with a thickness of 5 to 25 μm attaching the copper foil ground layer 320 and the insulating layer 330 using a second adhesive agent; and a copper foil power wire 318 with a thickness of 17 to 40 μm being attached at a distance from any one of the first pad 312 and the second pad 314 of the copper foil large capacity signal wire 310.

According to an embodiment of the present invention, the FPCB for the large capacity signal transmission medium may further include: a third adhesive layer 370 with a thickness of 20 to 30 μm being provided on the first adhesive layer 340 to cover the copper foil large capacity signal wire 310 and the copper foil power wire 318; a first coverlay layer 380 with a thickness of 7 to 17 μm being attached onto the third adhesive layer 370 to protect the copper foil large capacity signal wire 310; a fourth adhesive layer 390 with a thickness of 20 to 30 μm being sprayed over the copper foil ground foil 320; and a second coverlay layer 400 with a thickness of 7 to 17 μm being attached onto the fourth adhesive layer 390 to protect the copper foil ground layer 320.

The entire thickness of the FPCB for the large capacity signal transmission constructed as above may be within a range of 108 to 394 μm.

Although a few exemplary embodiments have been shown and described, it would be appreciated by those skilled in the art that changes may be made in these exemplary embodiments without departing from the principles and spirit of the disclosure, the scope of which is defined by the claims and their equivalents.

According to embodiments of the present invention, there is provided a flexible printed circuit board (FPCB) that may have an excellent low-voltage differential signaling (LVDS) signal transmission performance and flexibility, and may be manufactured in various types of shapes, have an excellent heat-resistance, and maintain a regular signal transmission quality due to a less impedance change. Also, it is possible to automate a manufacturing process and to manufacture the entire thickness of the FPCB to be less than 400 μm and thereby apply the FPCB for a light and slim product. Also, it is possible to manufacture a minute signal line and the FPCB with an excellent EMC characteristic.

What is claimed is:

1. A flexible printed circuit board (FPCB) for a large capacity signal transmission medium, the FPCB comprising:
    a copper foil large capacity signal wire including a plurality of first pads and a plurality of second pads that are spaced apart from each other at predetermined intervals and are alternately provided, to receive a large capacity signal from a television main board and to transmit the received large capacity signal to a display device, wherein the first pad has a positive phase and the second pad has a negative phase;
    a copper foil ground layer being attached at a distance from the cooper foil large capacity signal layer to ground the large capacity signal that is transmitted to and is returned from the display device;
    an insulating layer being attached between the copper foil large capacity signal wire and the copper ground layer to insulate between the copper foil large capacity signal wire and the cooper foil ground layer;
    a first adhesive layer with a thickness of 5 to 25 μm attaching the first pad and the second pad of the copper foil large capacity signal wire and the insulating layer using a first adhesive agent;
    a second adhesive layer with a thickness of 5 to 25 μm attaching the copper foil ground layer and the insulating layer using a second adhesive agent;
    a copper foil power wire with a thickness of 17 to 40 μm being attached at a distance from any one of the first pad and the second pad of the copper foil large capacity signal wire;
    a third adhesive layer with a thickness of 20 to 30 μm being provided on the first adhesive layer to cover the copper foil large capacity signal wire and the copper foil power wire;
    a first coverlay layer with a thickness of 7 to 17 μm being attached onto the third adhesive layer to protect the copper foil large capacity signal wire;
    a fourth adhesive layer with a thickness of 20 to 30 μm being sprayed over the copper foil ground foil; and
    a second coverlay layer with a thickness of 7 to 17 μm being attached onto the fourth adhesive layer to protect the copper foil ground layer;
    wherein a width of each of the first pad and the second pad of the copper foil large capacity signal wire has a range of 40 to 400 μm, an interval between the first pad and the second pad has a range of 40 to 450 μm, a thickness of each of the first pad, the second pad, and the copper foil ground layer has a range of 17 to 40 μm, and a thickness of the insulating layer has a range of 10 to 170 μm, so that the first pad and the second pad are controlled to be 80 to 110Ω impedance.

2. The FPCB of claim 1, wherein the large capacity signal is a low-voltage differential signaling (LVDS) signal.

3. The FPCB of claim 1, wherein the insulating layer is formed of polyimide of which a dielectric constant is 2.0 to 3.5.

4. A flexible printed circuit board (FPCB) for a large capacity signal transmission medium, the FPCB comprising:
    a copper foil large capacity signal wire including a plurality of first pads and a plurality of second pads that are spaced apart from each other at predetermined intervals and are alternately provided, to receive a large capacity signal from a television main board and to transmit the received large capacity signal to a display device, wherein the first pad has a positive phase and the second pad has a negative phase;
    a copper foil ground layer being attached at a distance from the cooper foil large capacity signal layer to ground the large capacity signal that is transmitted to and is returned from the display device;
    an insulating layer being attached between the copper foil large capacity signal wire and the copper ground layer to insulate between the copper foil large capacity signal wire and the cooper foil ground layer;
    a first adhesive layer with a thickness of 5 to 25 μm attaching the first pad and the second pad of the copper foil large capacity signal wire and the insulating layer using a first adhesive agent;
    a second adhesive layer with a thickness of 5 to 25 μm attaching the copper foil ground layer and the insulating layer using a second adhesive agent;
    a copper foil power wire with a thickness of 17 to 40 μm being attached at a distance from any one of the first pad and the second pad of the copper foil large capacity signal wire;
    a third adhesive layer with a thickness of 20 to 30 μm being provided on the first adhesive layer to cover the copper foil large capacity signal wire and the copper foil power wire;
    a first coverlay layer with a thickness of 7 to 17 μm being attached onto the third adhesive layer to protect the copper foil large capacity signal wire;
    a fourth adhesive layer with a thickness of 20 to 30 μm being sprayed over the copper foil ground foil; and
    a second coverlay layer with a thickness of 7 to 17 μm being attached onto the fourth adhesive layer to protect the copper foil ground layer;
    wherein the entire thickness of the FPCB is within a range of 108 to 394 μm.

* * * * *